(12) United States Patent
Oh et al.

(10) Patent No.: US 6,256,763 B1
(45) Date of Patent: Jul. 3, 2001

(54) REED-SOLOMON DECODER HAVING A NEW POLYNOMIAL ARRANGEMENT ARCHITECTURE AND DECODING METHOD THEREFOR

(75) Inventors: Kyu-taeg Oh, Seoul; Ji-sung Oh, Sungnam, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/172,081

(22) Filed: Oct. 14, 1998

(30) Foreign Application Priority Data

Oct. 14, 1997 (KR) .................................................. 97-52641

(51) Int. Cl.$^7$ .................................................. H03M 13/00
(52) U.S. Cl. ............................................................ 714/784
(58) Field of Search ................................... 714/784, 782, 714/781

(56) References Cited

U.S. PATENT DOCUMENTS

| | | | |
|---|---|---|---|
| 4,868,828 | * | 9/1989 | Shao et al. ............................ 714/704 |
| 5,341,385 | * | 8/1994 | Shirota ................................. 714/784 |
| 5,805,616 | * | 9/1998 | Oh ........................................ 714/784 |
| 6,122,766 | * | 9/2000 | Fukuoka et al. ...................... 714/784 |

OTHER PUBLICATIONS

H.M. Shao and I.S. Reed: "On the VLSI Design of Pipeline Reed–Solomon Decoder using Systolic Arrays" IEEE Transactions on Computers, part 37, No. 10, Oct. 1988, pp. 1273–1280. XP000884593.

H.M. Shao, T.K. Truong, L.J. Deutch, J.H. Yuen and I.S. Reed: "A VLSI Design of a Pipeline Reed–Solomon Decoder" IEEE Transactions on Computers, part c–34, No. 5, May 1985, pp. 393–403. XP000647438.

Youshi Xu: "A Modified Euclidean Algorithm and the VLSI Implementation" MELECON Mediterranean Electrotechnical Conference IEEE, May 13, 1996, pp. 1324–1327. XP000696013.

D.M. Mandelbaum: "On Iterative Arrays for the Euclidean Algorithm over Finite Fields" IEEE Transactions on Computers, part 38, No. 10, Oct. 1989, pp. 1473–1478. XP002132123.

Oh, An Efficient Reed–Solomon Decoder VLSI with Erasure Correction, IEEE, p. 193–201, 1997.*

Kwon et al., An Area Efficient VLSI Architecture of a Reed–Solomon Decoder/Encoder for Digital VCR's, IEEE, p. 1019–1027, Jun. 1997.*

Truong et al., Simplified procedure for correcting both errors and erasures of Reed–Solomon code using Euclidean algorithm, IEEE, p. 318–321, 1997.*

* cited by examiner

*Primary Examiner*—Albert Decady
*Assistant Examiner*—Shelly A Chase
(74) *Attorney, Agent, or Firm*—Sughrue, Mion, Zinn, Macpeak & Seas, PLLC

(57) ABSTRACT

A Reed-Solomon (RS) decoder and a decoding method therefor are provided. The RS decoder includes a calculator for iteratively calculating four polynomials R(x), Q(x), λ(x), and μ(x) for the modified Euclidean algorithm using input initial error locator polynomial and modified syndrome polynomial, an arranger for arranging the coefficients of the respective polynomials from the left, a generator for generating control signals for showing the effective sections of the respective polynomials using an iterative control signal for announcing the beginning of every iterative calculation, and an extractor for extracting the polynomial R(x) supplied from the calculator as an error estimator polynomial and the polynomial λ(x) as an error locator polynomial on the basis of the control signals. The RS decoder is simplified since an additional degree comparing circuit and degree buffering is not necessary.

20 Claims, 7 Drawing Sheets ss

R_CTL

Q_CTL time ←

REED-SOLOMON DECODER HAVING A NEW POLYNOMIAL ARRANGEMENT ARCHITECTURE AND DECODING METHOD THEREFOR

BACKGROUND OF THE INVENTION

1. Field of the Invention

The present invention relates to an error correction decoding field, and more particularly, to a Reed-Solomon (RS) decoder having a new polynomial arrangement architecture for realizing a modified Euclidean algorithm and a decoding method therefor.

2. Description of the Related Art

A RS decoder is generally used for correcting errors generated during transmission in a digital communication system using a high definition television (HDTV), a digital versatile disc (DVD), or a compact disc (CD). Although, the RS decoder has excellent error correcting capability, it has a very complicated architecture. In general, an RS code is expressed as RS(N,I). One packet of information is constructed of N symbols. Among these symbols, I symbols show a message and the rest N-I symbols show a parity. Each symbol is comprised of m bits.

FIG. 1 is a block diagram of a conventional RS decoder using a modified Euclidean algorithm, which is disclosed in "On the VLSI Design of a Pipeline Reed-Solomon Decoder Using Systolic Arrays", H. M. Shao and I. S. Reed, IEEE Trans. Comput, vol. 37, October 1988, pp. 1273–1280.

In FIG. 1, the root $\alpha^{-i}$ of an initial error locator polynomial calculated by input erasure location information is input to first and second polynomial expanders 106 and 108. An erasure indicates an error, the location of which is known from the received data.

The initial error locator polynomial $\Gamma(x)$ expanded by the first polynomial expander 106 can be represented by Equation 1. A modified syndrome polynomial $T(x)$ which is a key equation expanded by the second polynomial expander 108 can be represented by Equation 2.

$$\Gamma(x) = \prod_{\alpha^{-i} \in \Gamma} (x - \alpha^{-i}) \quad \text{[EQUATION 1]}$$

wherein, $\Pi$ represents a multiplication. The root of the initial error locator polynomial $\Gamma(x)$ shows the location where an error is generated. Namely, if $\alpha^{-i}$ is the root, the error is generated in the (i+1)th code word among received code words. In the (i+1)th code word, the code index corresponds to i.

$$T(x) = S(x)\Gamma(x) \bmod x^{2t} \quad \text{[EQUATION 2]}$$

wherein, $T(x)$, $S(x)$, and $t$ respectively represent a modified syndrome polynomial, a syndrome polynomial, and the number of being capable of correcting errors.

When the calculation of the initial error locator polynomial and the modified syndrome polynomial is completed, an error evaluator polynomial $\omega(x)$ and an error locator polynomial $\sigma(x)$ are extracted by a modified Euclidean algorithm calculator 110 using the modified Euclidean algorithm.

When the iterative equations represented in Equations 4 through 7 are iterated 2t times, the desired error evaluator polynomial $\omega(x)$ and error locator polynomial $\sigma(x)$ are obtained as a result by the modified Euclidean algorithm calculator 110. These are called the modified Euclidean algorithm, which is provided in the above document by H. M. Shao and I. S. Reed.

$$\mu_0(x)=\Gamma(x), R_0(x)=x^{2t}, \lambda_0(x)=0, Q_0(x)=T(x) \quad \text{[EQUATION 3]}$$

$$R_i(x)=[\sigma_{i-1}b_{i-1}R_{i-1}(x)+\overline{\sigma_{i-1}}a_{i-1}Q_{i-1}(x)]-x^{|l_{i-1}|}[\sigma_{i-1}a_{i-1}Q_{i-1}(x)+\sigma_{i-1}b_{i-1}R_{i-1}(x)] \quad \text{[EQUATION 4]}$$

$$\lambda_i(x)=[\sigma_{i-1}b_{i-1}\lambda_{i-1}(x)+\overline{\sigma_{i-1}}a_{i-1}\mu_{i-1}(x)]-x^{|l_{i-1}|}[\sigma_{i-1}a_{i-1}\mu_{i-1}(x)+\sigma_{i-1}b_{i-1}\lambda_{i-1}(x)] \quad \text{[EQUATION 5]}$$

$$Q_i(x)=\sigma_{i-1}Q_{i-1}(x)+\overline{\sigma_{i-1}}R_{i-1}(x) \quad \text{[EQUATION 6]}$$

$$\mu_i(x)=\sigma_{i-1}\mu_{i-1}(x)+\overline{\sigma_{i-1}}\lambda_{i-1}(x) \quad \text{[EQUATION 7]}$$

wherein $a_{i-1}$ and $b_{i-1}$ are respectively the coefficients of the highest degree terms of $R_{i-1(x)}$ and $Q_{i-1(x)}$.

$$l_{i-1}=\deg(R_{i-1}(x))-\deg(Q_{i-1}(x)) \quad \text{[EQUATION 8]}$$

$$\sigma_{i-1} = \begin{cases} 1 & \text{if } l_{i-1} \geq 0 \\ 0 & \text{if } l_{i-1} < 0 \end{cases} \quad \text{[EQUATION 9]}$$

Namely, as shown in Equations 8 and 9, when the degree of $R_{i-1(x)}$ is equal to or larger than that of $Q_{i-1(x)}$, $\sigma_{i-1}$ has a value of "1". If not, $\sigma_{i-1}$ has a value of "0".

When the condition shown in the following Equation 10 is satisfied, the above iterative equations (Equations 4 through 7) are terminated.

$$\deg(\lambda_i(x))>\deg(R_i(x)) \quad \text{[EQUATION 10]}$$

When the above iterative equations (Equations 4 through 7) are completed, the error locator polynomial $\sigma(x)$ and the error evaluator polynomial $\omega(x)$ are obtained as shown in the equations 11 and 12.

$$\sigma(X)=\lambda_i(x) \quad \text{[EQUATION 11]}$$

$$\omega(x)=R_i(x) \quad \text{[EQUATION 12]}$$

The initial values of the four polynomials $R_i(x)$, $Q_i(x)$, $\lambda_i(x)$, and $\mu_i(x)$ are represented in the above Equation 3. The error locator polynomial $\sigma(x)$ and the error evaluator polynomial $\omega(x)$ can be obtained without repeating the iterative equations (Equations 4 through 7) 2t times, under the condition that the degree of $\lambda_i(x)$ is larger than that of $R_i(x)$. $\lambda_i(x)$ becomes the error locator polynomial and $R_i(x)$ becomes the error estimator polynomial.

A conventional polynomial arrangement architecture for realizing the modified Euclidean algorithm is represented in FIG. 2. In the polynomial arrangement shown in FIG. 2, the polynomials $R(x)$ and $Q(x)$, the degrees of which decrease as an iterative operation process proceeds, are arranged in registers 132 and 134 loaded in the modified Euclidean algorithm calculator 110 from the right side. The polynomials $\lambda(x)$ and $\mu(x)$, the degrees of which increase as an iterative operation process proceeds, are arranged in registers 136 and 138 from the left side. In this case, the degrees of the respective polynomials must be stored in an additional memory (not shown) for generating a control signal required for iterative calculations.

The conventional polynomial arrangement architecture for realizing the modified Euclidean algorithm has problems in that the degrees of the respective polynomials must always be stored in the additional memory, and as many as $\log_2 2t$ subtracters are required since the degrees must be compared as shown in Equation 8 for generating the control signal required for performing the above Equation 9. Further, the degrees must be buffered when the polynomials are buffered since the degrees of the polynomials will be used in subsequent iterative operations.

SUMMARY OF THE INVENTION

To solve the above problems, it is an objective of the present invention to provide an RS decoder of a simple architecture in which an additional degree comparing circuit is not necessary by changing the polynomial arrangement architecture when calculating a modified Euclidean algorithm.

It is another objective of the present invention to provide an RS decoding method for performing the modified Euclidean algorithm by changing the polynomial arrangement architecture.

It is still another objective of the present invention to provide a method for arranging the coefficients of the respective polynomials for performing the modified Euclidean algorithm from the left side.

Accordingly, to achieve the first objective, there is provided a Reed-Solomon (RS) decoder for correcting on error of a received symbol using a modified Euclidean algorithm, comprising a calculator for iteratively calculating four polynomials $R(x)$, $Q(x)$, $\lambda(x)$, and $\mu(x)$ for the modified Euclidean algorithm using input initial error locator polynomial and modified syndrome polynomial, an arranger for arranging the coefficients of the respective polynomials from the left, a generator for generating control signals for showing the effective sections of the respective polynomials using an iterative control signal for announcing the beginning of every iterative calculation, and an extractor for extracting the polynomial $R(x)$ supplied from the calculator as an error estimator polynomial and the polynomial $\lambda(x)$ as an error locator polynomial on the basis of the control signals.

To achieve the second objective, there is provided a Reed-Solomon (RS) decoder for searching the location and size of an error on the basis of syndrome values, comprising a first polynomial calculator for calculating a syndrome value from received data and constructing a syndrome polynomial, a first generator for generating a root for an initial error locator polynomial from the erasure information of the received data and an iterative control signal for announcing the beginning of iterative calculations whenever new erasure information is input, a first polynomial expander for expanding the initial error locator polynomial using the root, a second polynomial expander for expanding a modified syndrome polynomial using the syndrome value and the root, a modified Euclidean algorithm calculator for extracting an error estimator polynomial and an error locator polynomial using the initial error locator polynomial and the modified syndrome polynomial, second and third polynomial calculators for calculating the error estimator polynomial and error locator polynomial supplied from the modified Euclidean algorithm calculator, and an extractor for extracting the size and location of an error included in the received data from the error estimator polynomial and error locator polynomial calculated by the second and third polynomial calculators and error correction decoding the received data, wherein the modified Euclidean algorithm calculator comprises a calculator for iteratively calculating four polynomials $R(x)$, $Q(x)$, $\lambda(x)$, and $\mu(x)$ for the modified Euclidean algorithm using the initial error locator polynomial and the modified syndrome polynomial, an arranger for arranging the coefficients of the respective polynomials from the left and providing the coefficients of the arranged polynomials to the calculator, a control signal generator for generating the control signals of $R(x)$, $Q(x)$, and $\mu(x)$ showing the effective sections of the polynomials $R(x)$, $Q(x)$, and $\mu(x)$ using the iterative control signal, a storage for storing the firstly effective values of $R(x)$ and $Q(x)$ supplied from the arranger as the coefficients of the highest degree terms using the control signals of $R(x)$ and $Q(x)$ as enable signals, and providing them to the calculator, a select signal generator for generating a select signal using the control signals of $Q(x)$ and $\mu(x)$, and a selector for selecting the polynomial $R(x)$ supplied from the calculator according to the select signal as the error estimator polynomial and the polynomial $\lambda(x)$ as the error locator polynomial.

To achieve the third objective, there is provided an RS decoding method including a polynomial arranging step for performing a modified Euclidean algorithm, wherein the polynomial arranging step comprises the steps of (a) setting an initial state variable, (b) determining whether the coefficient of the highest degree term of one of $Q(x)$ and $R(x)$ is "0" and determining whether the degrees of the two polynomials are the same, if not, (c) calculating the respective polynomials $R(x)$, $Q(x)$, $\lambda(x)$, and $\mu(x)$, obtaining the next state variable by subtracting "1" from the current state variable, and arranging the coefficients of the calculated polynomials after delaying them when the degrees of the two polynomials are not the same in the step (b), (d) exchanging the coefficients of $R(x)$ with those of $Q(x)$ and the coefficients of $\lambda(x)$ with those of $\mu(x)$ after calculating the respective polynomials and setting the next state variable as "1" when the degrees of the two polynomials are the same in the step (b), (e) determining whether the coefficient of the highest degree term of $R(x)$ is "0" when the coefficient of the highest degree term of one of the two polynomials $Q(x)$ and $R(x)$ is "0" in the step (b), (f) moving the coefficients of the two polynomials $Q(x)$ and $\mu(x)$ to the right by one degree after exchanging the coefficients of $R(x)$ with those of $Q(x)$ and the coefficients of $\lambda(x)$ with those of $\mu(x)$ and setting the next state variable as the value obtained by adding "1" to the current state variable when the coefficient of the highest degree term of $R(x)$ is "0" in the step (e), and (g) moving the coefficients of the two polynomials $Q(x)$ and $\mu(x)$ to the right by one degree and setting the next state variable as the value obtained by adding "1" to the current state variable when the coefficient of the highest degree term of $Q(x)$ is "0" in the step(e).

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 3:
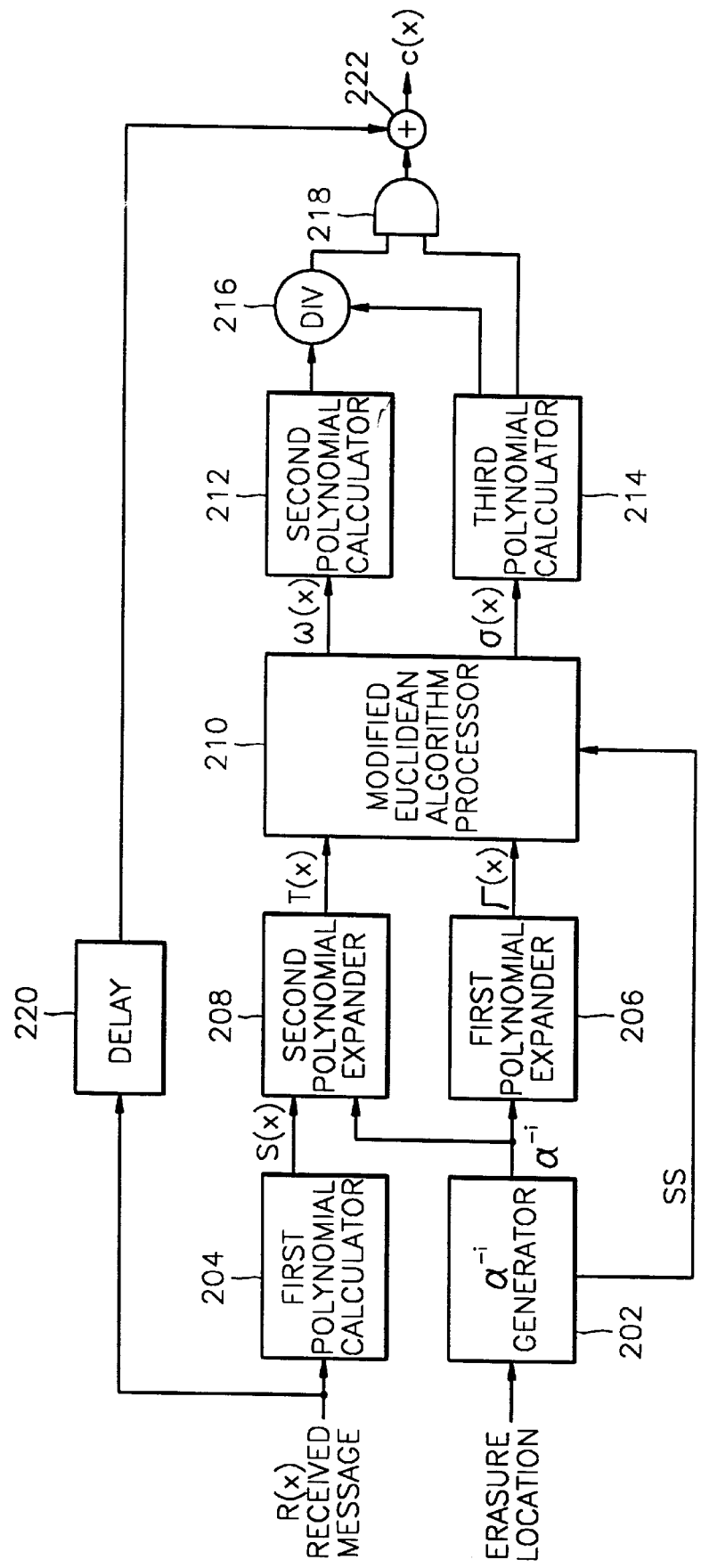
FIG. 3 is a block diagram of an RS decoder according to the present invention.

FIG. 3 is a block diagram of an RS decoder according to the present invention. A $\alpha^{-i}$ generator 202 generates the root $\alpha^{-i}$ of an initial error locator polynomial using input erasure locator information and an iterative control signal (ss) for indicating the beginning of every iterative calculation with respect to new erasure information $\alpha^{-i}$ and outputs the generated iterative control signal (ss) to a modified Euclidean algorithm calculator 210. A first polynomial expander 206 expands an initial error locator polynomial $\Gamma(x)$ using $\alpha^{-i}$ output from the $\alpha^{-i}$ generator 202.

A first polynomial calculator 204 calculates the syndrome values of received data and constructs a syndrome polynomial S(x). Equation 13 is a syndrome polynomial of 2t−1 degree having the calculated syndrome values as coefficients.

$$S(x)=S_0+S_1 x+S_2 x^2+ \ldots +S_{2t-1}x^{2t-1} \quad \text{[EQUATION 13]}$$

A second polynomial expander 208 solves a key equation represented in Equation 2 using the syndrome polynomial S(x) calculated by the first polynomial calculator 204 and $\alpha^{-i}$ output from the $\alpha^{-i}$ generator 202 and expands a modified syndrome polynomial T(x).

The modified Euclidean algorithm calculator 210 calculates the modified Euclidean algorithm through a series of iterative calculations for obtaining the error locator polynomial $\sigma(x)$ and the error estimator polynomial $\omega(x)$ using the initial error locator polynomial $\Gamma(x)$ and the modified syndrome polynomial T(x) supplied from the first and second polynomial expanders 206 and 208.

Second and third polynomial calculators 212 and 214 calculate the error estimator polynomial $\omega(x)$ and the error locator polynomial $\sigma(x)$ output from the modified Euclidean algorithm calculator 210 and provided them to a divider 216. The divider 216 calculates the size of an error by Equation 14 with respect to $\alpha^{-i}$.

$$\hat{e}_i = -\frac{\omega(\alpha^{-i})}{\sigma'(\alpha^{-i})} \quad \text{[EQUATION 14]}$$

An AND gate 218 permits selection of only the output of the divider 216 corresponding to the root of the error locator polynomial $\sigma(x)$ calculated by the third polynomial calculator 214. An adder 222 can be constructed by an exclusive-OR gate for performing an exclusive-OR operation on the received data delayed by the delay 220 and the output of the AND gate 218. Error correction decoded data is output from the adder. At this time, c(x) denotes a corrected data polynomial. The divider 116, the AND gate 118, and the adder 122 can be called extractors.

Figure 4:
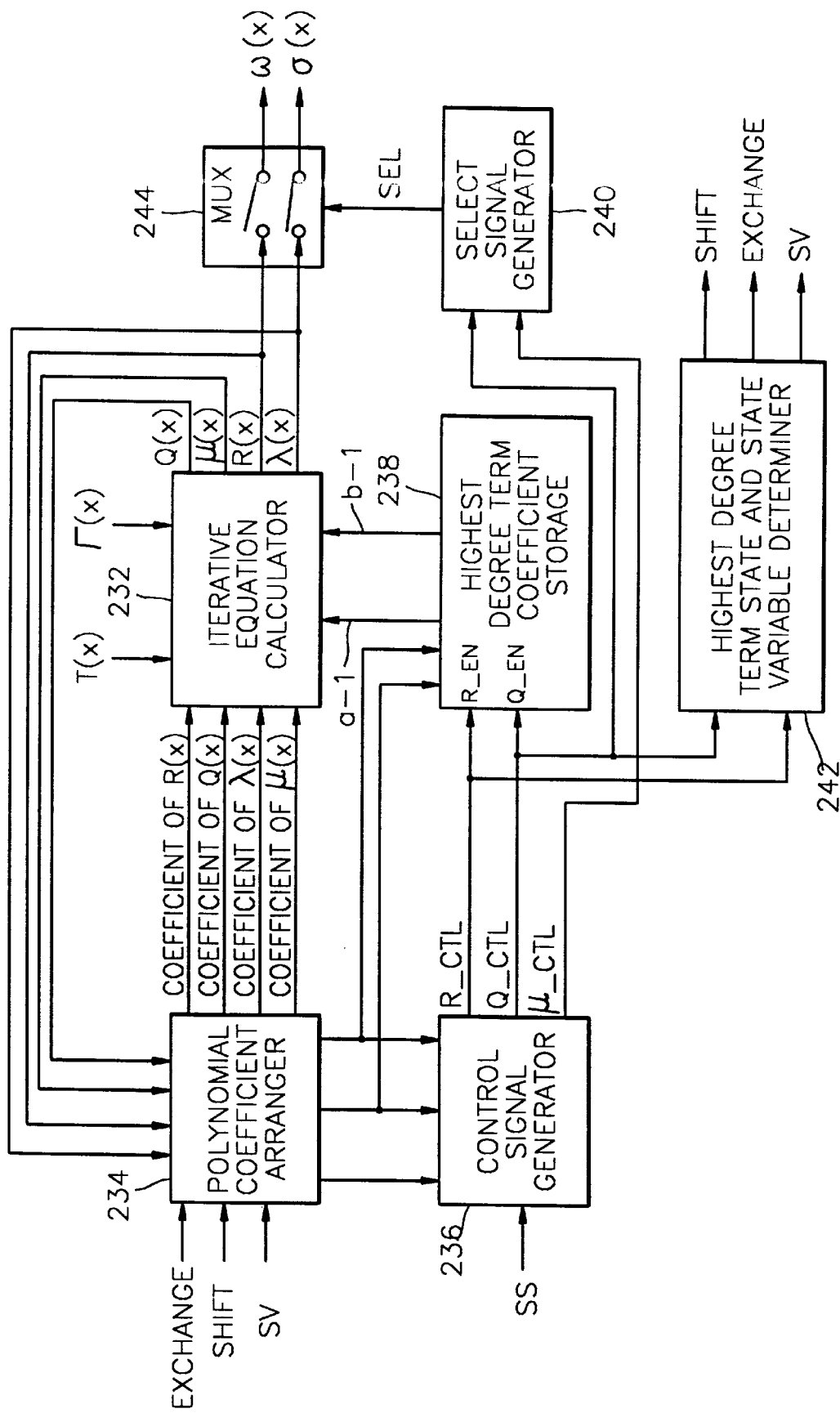
FIG. 4 is a detailed block diagram of a modified Euclidean algorithm calculator shown in FIG. 3.

FIG. 4 is a detailed block diagram of the modified Euclidean algorithm calculator 210 shown in FIG. 3. An iterative equation calculator 232 receives the initial error locator polynomial $\Gamma(x)$ and the modified syndrome polynomial T(x) provided by the first and second polynomial expanders 206 and 208 shown in FIG. 3, provides the coefficients of the respective polynomials to a polynomial coefficient arranger 234, and calculates the iterative equations (Equations 4 through 7) for the respective polynomials using the coefficients of the respective polynomials arranged in the polynomial coefficient arranger 234 and the coefficients of the terms of the highest degree of R(x) and Q(x) provided by a highest degree term coefficient storage 238. At this time, the iterative equation calculator 232 terminates the iterative equation when the condition represented in Equation 15 is satisfied.

$$\deg(\mu_i(x))>\deg(Q_i(x)) \quad \text{[EQUATION 15]}$$

Figure 1:
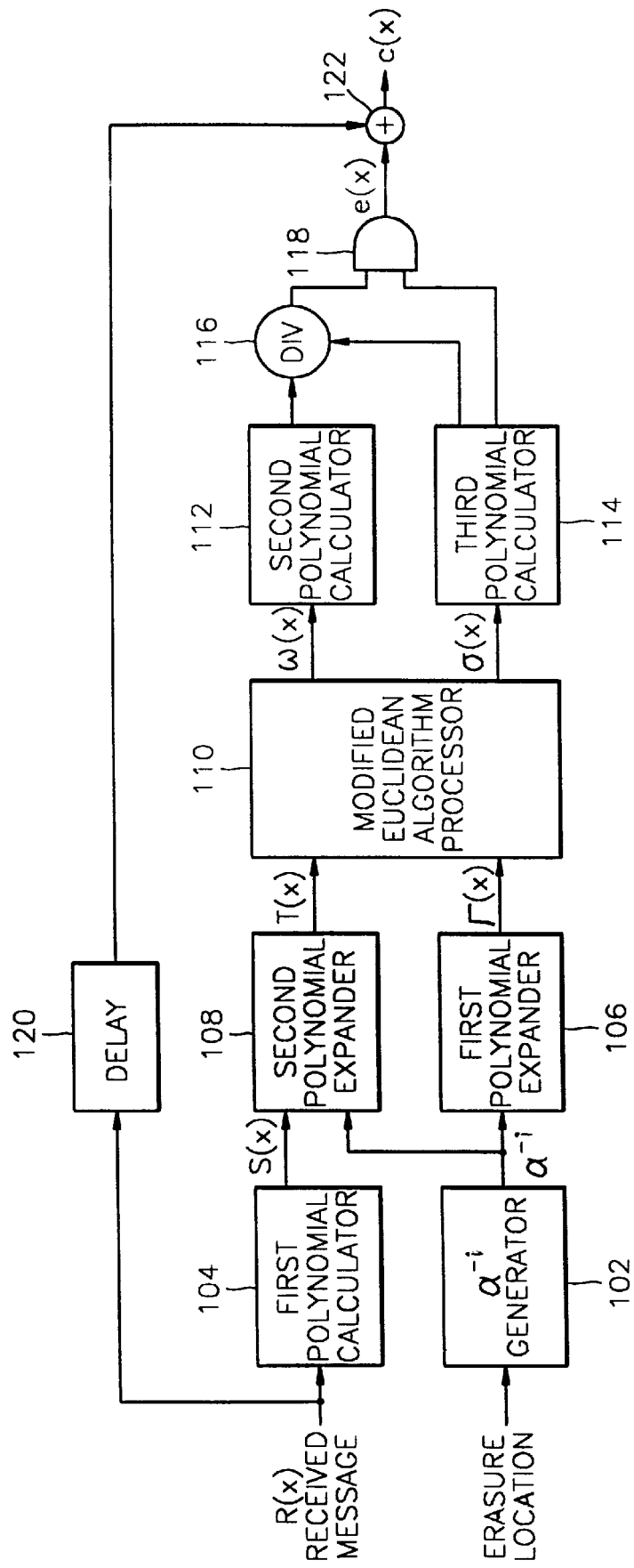
FIG. 1 is a block diagram of a conventional RS decoder.
Figure 2:
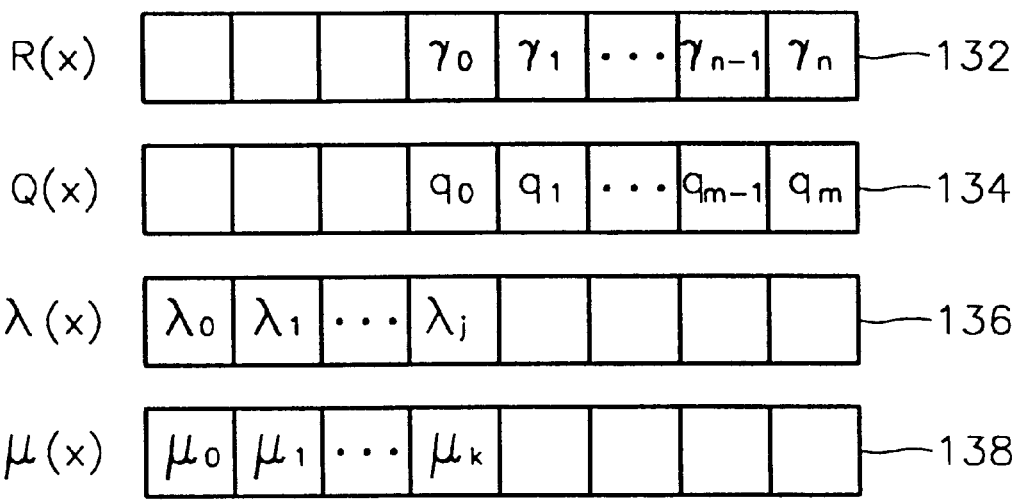
FIG. 2 shows a conventional polynomial arrangement architecture.
Figure 5:
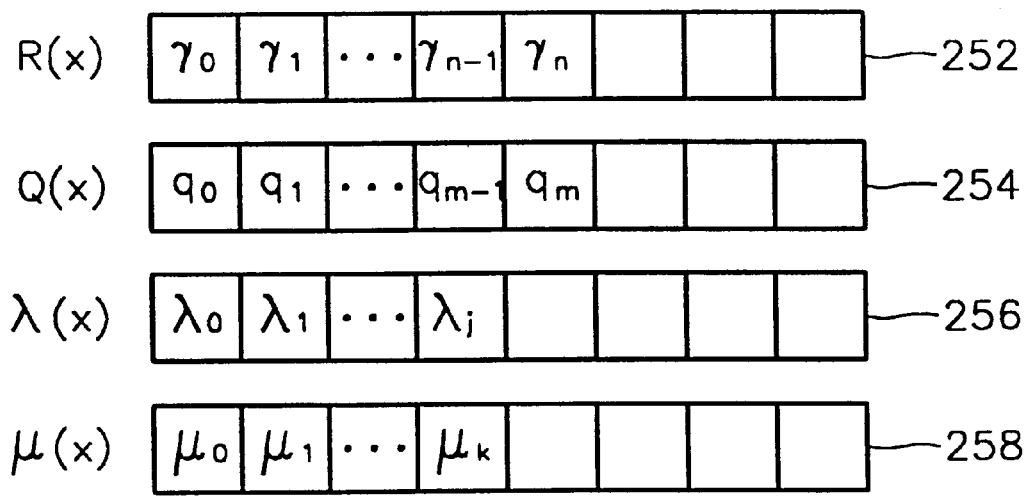
FIG. 5 shows a polynomial arrangement architecture provided in the present invention.

The polynomial coefficient arranger 234 arranges all the polynomials (R(x), Q(x), $\lambda(x)$, and $\mu(x)$) in the registers 252 through 258 from the left side as shown in FIG. 5.

Whenever the polynomials R(x) and Q(x) are iteratively calculated by the iterative equation calculator 232, the results of the iterative calculations are fed back to the polynomial coefficient arranger 234 and shifted to the right by one degree. Therefore, the polynomials cannot be arranged to the left by storing the output values with respect to R(x) and Q(x) supplied from the iterative equation calculator 232.

Therefore, the polynomial must be delayed according to the iterative control signal ss. For this, in the polynomial coefficient arranger 234, a delay (not shown) is included in the front end of the registers 252 through 258 shown in FIG. 5. Whether the polynomial is to be delayed by the delay is determined on the basis of a state variable (SV) value supplied from a highest degree term state and state variable determiner 242.

Namely, when a state variable, showing that the degrees of the polynomials R(x) and Q(x) obtained from the results of the iterative calculations by the iterative calculator 232 are the same, is provided, the two polynomials R(x) and Q(x) are delayed by one clock. When a state variable, showing that the coefficient of one polynomial obtained from the results of the iterative calculations is larger than that of the other polynomial, for example, by one degree, is provided, the coefficient of the last lowest degree is cut off if the polynomials are delayed by the delay since the polynomial having a higher degree is already arranged to the left. Therefore, the output value of the iterative calculator 232 is not delayed by the delay and is stored in registers 252 and 254.

The polynomial $\lambda(x)$ is delayed depending on the polynomial R(x) which forms a pair. The polynomial $\mu(x)$ is delayed depending on the polynomial Q(x) which forms a pair.

At this time, when the degree of the polynomial R(x) is lower than that of the polynomial Q(x), an exchange control signal (EXCHANGE) supplied from the highest degree term state and state variable determiner 242 is provided to the polynomial coefficient arranger 234. In the polynomial coefficient arranger 234, the coefficient of R(x) stored in the register 252 is exchanged with the coefficient of Q(x) stored in the register 254 and the coefficient of $\lambda(x)$ stored in the register 256 is exchanged with the coefficient of $\mu(x)$ stored in the register 258. This is for facilitating the polynomial arrangement in the iterative calculations. Accordingly, the condition under which the iterative calculations are terminated since the degree of R(x) is always higher than or the same as that of Q(x) is represented in Equation 15.

When the coefficients of the polynomials are arranged as mentioned above, the polynomial arrangement architecture provided in the present invention is obtained as shown in FIG. 5. Since the coefficients are operated one by one from the right in this polynomial arrangement architecture, the coefficient of the highest degree term has a value other than "0" for the first time, starting from the right. The position of the coefficient becomes the degree of the polynomial. The comparison of the degrees of the respective polynomials is performed by comparing the positions with each other. This will be described in a select signal generator 240.

The control signal generator 236 generates control signals R_CTL, Q_CTL_Q, and μ_CTL showing the effective sections of the respective polynomials R(x), Q(x), and μ(x) using the coefficients of the respective polynomials R(x), Q(x), and μ(x) supplied from the polynomial coefficient arranger 234 and the iteration control signal ss for indicating the beginning of every iterative calculation supplied by the $\alpha^{-i}$ generator 202 shown in FIG. 3.

Namely, the control signal generator 236 assigns control signals of 1 bit to the respective polynomials R(x), Q(x), and μ(x), maintains the values of control signals for the respective polynomials as "1" when the iterative control signal ss for announcing the beginning of the iterative calculations, and changes the control signal of 1 bit assigned to the polynomial having coefficients other than "0" into "0" when a coefficient other than "0" is input to the polynomial coefficient arranger 234 for the first time.

Figure 6:
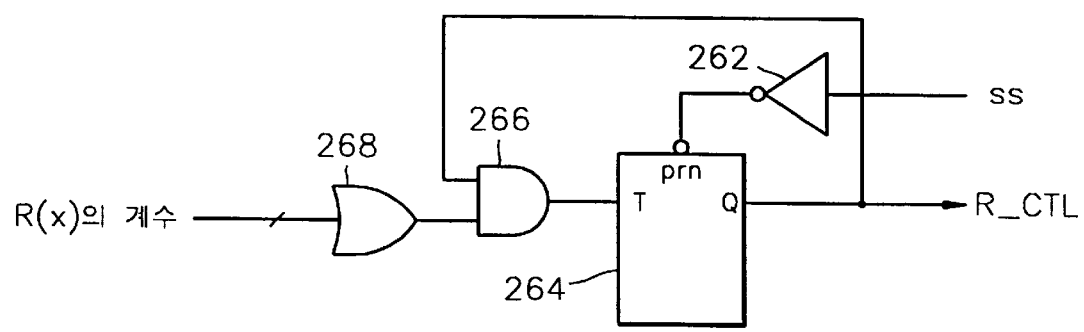
FIG. 6 is a circuit diagram showing a part of the control signal generator shown in FIG. 4.

FIG. 6 is a circuit diagram illustrating a portion of the control signal generator 236 shown in FIG. 4 for generating a control signal (R_CTL) assigned to the polynomial R(x). In FIG. 6, when the iterative control signal ss is inverted by an inverter 262 and is provided to an inversion preset terminal of a T flip-flop 264, the output (R_CTL) of the T flip-flop 264 is at a logic "high". The output (R_CTL) is fed back to an AND gate 266.

An OR gate 268 provides the output of logic "high" when an effective value other than "0" is input as a coefficient supplied from the register 252 of the polynomial coefficient arranger 234 shown in FIG. 5. The AND gate 266 also provides the output of logic "high" to a toggle terminal (T) of the T flip-flop 264. Then, the output (R_CTL) of the T flip-flop 264 is at logic "low", which means the output is in an effective section. Once the output turns out to be in the effective section, the output is maintained to be at logic "low" until the iterative control signal ss of logic "high" showing that the next iterative calculation begins is applied.

Control signals (R_CTL and Q_CTL) assigned to R(x) and Q(x) supplied from the control signal generator 236 shown in FIG. 4 are used as enable signals (R_EN and Q_EN) of the highest degree term storage 238 for storing the coefficients of the highest degree terms of R(x) and Q(x). The highest degree term coefficient storage 238 stores the first effective values supplied from the registers 252 and 254 of the polynomial coefficient arranger 234 as the coefficients (a–1 and b–1) of the highest degree terms of R(x) and Q(x), using the control signals (R_CTL and Q_CTL) assigned to R(x) and Q(x).

Therefore, according to the present invention, it is possible to store the coefficient of the highest degree term using the control signals CTL_R and CTL_Q generated by the control signal generator 236 without generating an additional signal for storing the coefficient of the highest degree term and to obtain a select signal SEL of a multiplexer (MUX) 244 required for determining the output values of the iterative equation calculator 232 using control signals Q_CTL and μ_CTL generated by the control signal generator 236.

Figure 7A:
FIGS. 7A–7C are waveform diagrams for explaining how to discriminate the term of the highest degree using a control signal generated by the control signal generator shown in FIG. 4.
Figure 7B:
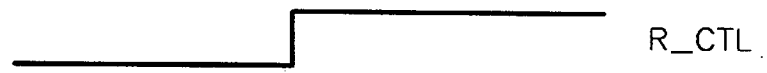
Figure 7C:

FIG. 7A illustrates a waveform of the iterative control signal ss for announcing the beginning of every iterative calculation. Signals shown in FIGS. 7B and 7C are the control signals R_CTL and Q_CTL assigned to R(x) and Q(x). When the control signal R_CTL shown in FIG. 7B is at logic "low" earlier than the control signal Q_CTL shown in FIG. 7C, it is noted that the degree of R(x) is higher than that of Q(x). A MUX select signal is generated by comparing the degrees of the respective polynomials by a subtraction operation in a conventional technology.

However, in the present invention, the select signal generator 240 generates a select signal (SEL) using the control signal Q_CTL of Q(x) and the control signal μ_CTL of μ(x), output from the control signal generator 236 and provides the select signal (SEL) to the multiplexer 244. Namely, the select signal generator 240 outputs the select signal (SEL) of logic "high" showing that the iterative calculations are terminated when the control signal Q_SEL of Q(x) is not in the effective section (logic "high") and the control signal (μ_CTL) of μ(x) is determined to be in the effective section (logic "low"), namely, when the degree of μ(x) is higher than that of Q(x).

Therefore, the multiplexer 244 outputs R(x) Output from the iterative equation calculator 232 according to the select signal SEL of logic "high" as the error estimator polynomial ω(x) and λ(x) as the error locator polynomial σ(x).

The reason why the degree of μ(x) is compared with that of Q(x) is as follows. In order to check whether iterative calculations are terminated, it is checked whether either the degree of R(x) or that of Q(x) is lower than that of μ(x). If so, the iterative operations are terminated. A polynomial having a lower degree between R(x) and Q(x) is taken to the error estimator polynomial ω(x). μ(x) is taken to the error locator polynomial σ(x). When the degree of Q(x) is maintained to always be lower than that of R(x), it is possible to obtain the desired error locator polynomial σ(x) and error estimator polynomial ω(x) by comparing μ(x) with Q(x).

When the iterative calculations are not terminated, it must be checked whether the coefficient of the highest degree term of R(x) or that of Q(x) is "0" or not. It is possible to know when the value which is not "0" appears using the control signals R_CTL and Q_CTL since R(x) and Q(x) are arranged to the left. Accordingly, it is possible to know whether the coefficients of the highest degree terms of the two polynomials are "0".

Namely, when the control signal R_CTL of R(x) is in the effective section (logic "low") and the control signal Q_CTL of Q(x) is not in the effective section (logic "high"), the coefficient of the highest degree term of Q(x) is "0". When the control signal Q_CTL of Q(x) is in the effective section (logic "low") and the control signal R_CTL of R(x) is not in the effective section (logic "high"), the coefficient of the highest degree term of R(x) is "0".

When one of the coefficients of the highest degree terms is "0", the iterative calculation of this time is meaningless. In order to prevent this and for the next iterative calculation, the highest degree term state and state variable determiner 242 provides the exchange control signal EXCHANGE for exchanging the coefficients of R(x) with those of Q(x) and the coefficient of μ(x) with those of λ(x) when the fact that the coefficient of the highest degree term of R(x) is "0" is known using the control signals R_CTL and Q_CTL of R(x) and Q(x) and a shift signal SHIFT for moving the polynomial R(x) and λ(x) forming a pair with R(x) to right by one degree to the polynomial coefficient arranger 234 and provides only a shift signal SHIFT for moving the polynomial Q(x) and μ(x) forming a pair with Q(x) to the right by one degree to the polynomial coefficient arranger 234 when the coefficient of the highest degree term of Q(x) is "0". To move a polynomial to the right by one degree means to multiply x with the polynomial having "0" as the coefficient of the highest degree term and the polynomial forming a pair.

Also, the highest degree term state and state variable determiner 242 determines the state variable (SV) showing a difference between the degree of the highest degree term of R(x) and the degree of the highest degree term of Q(x) and outputs the SV to the polynomial coefficient arranger 234.

When the iterative calculations are not terminated and the coefficient of the highest degree term of either R(x) or Q(x) is not "0", the iterative calculator 232 feeds back the coefficient with respect to the operation result obtained by the iterative equations represented in Equations 4 through 7 to the polynomial coefficient arranger 234.

The process of calculating the modified Euclidean algorithm performed in the modified Euclidean algorithm calculator 210 shown in FIG. 4 is as follows.

Step 1: the coefficients of all the polynomials R(x), Q(x), λ(x), and μ(x) are arranged from the left as shown in FIG. 5. By doing so, it is possible to easily compare the degrees of the respective polynomials with each other, without storing the degrees.

Step 2: it is checked from where the coefficients of the effective polynomials begin in the coefficients arranged from the left and the coefficients of the highest degree terms of the polynomials R(x) and Q(x) are stored.

Step 3: the degrees of the two polynomials Q(x) and μ(x) are compared with each other using the control signal assigned to Q(x) and μ(x).

Step 4: when the degree of μ(x) is higher than that of Q(x) in the step 3, R(x) is output as the error estimator polynomial ω(x) and λ(x) is output as the error locator polynomial σ(x). At this time, the degree of R(x) is assumed to be larger than that of Q(x).

Step 5: when the degree of μ(x) is not higher than that of Q(x), it is determined whether one of the coefficients of the highest degree terms of R(x) and Q(x) is "0".

Step 6: when one of the coefficients of the highest degree terms of the two polynomials R(x) and Q(x) is "0", the coefficients of the polynomial having the coefficient of the highest degree term of which is "0" and the polynomial forming a pair are shifted to the right by one degree. At this time, when the coefficient of the highest degree term of R(x) is "0", the coefficients of Q(x) and μ(x) are shifted to the right by one degree after exchanging R(x) with Q(x) and μ(x) with λ(x). When the coefficient of the highest degree term of Q(x) is "0", the coefficients of Q(x) and μ(x) are shifted to the right by one degree.

Step 7: when the degree of μ(x) is not higher than that of Q(x) and the coefficients of the highest degree terms of R(x) and Q(x) are not "0" in the step 5, the iterative equations shown in Equations 4 through 7 are calculated using the coefficients of the highest degree terms of the polynomials R(x) and Q(x) stored in the step 2.

Figure 8:
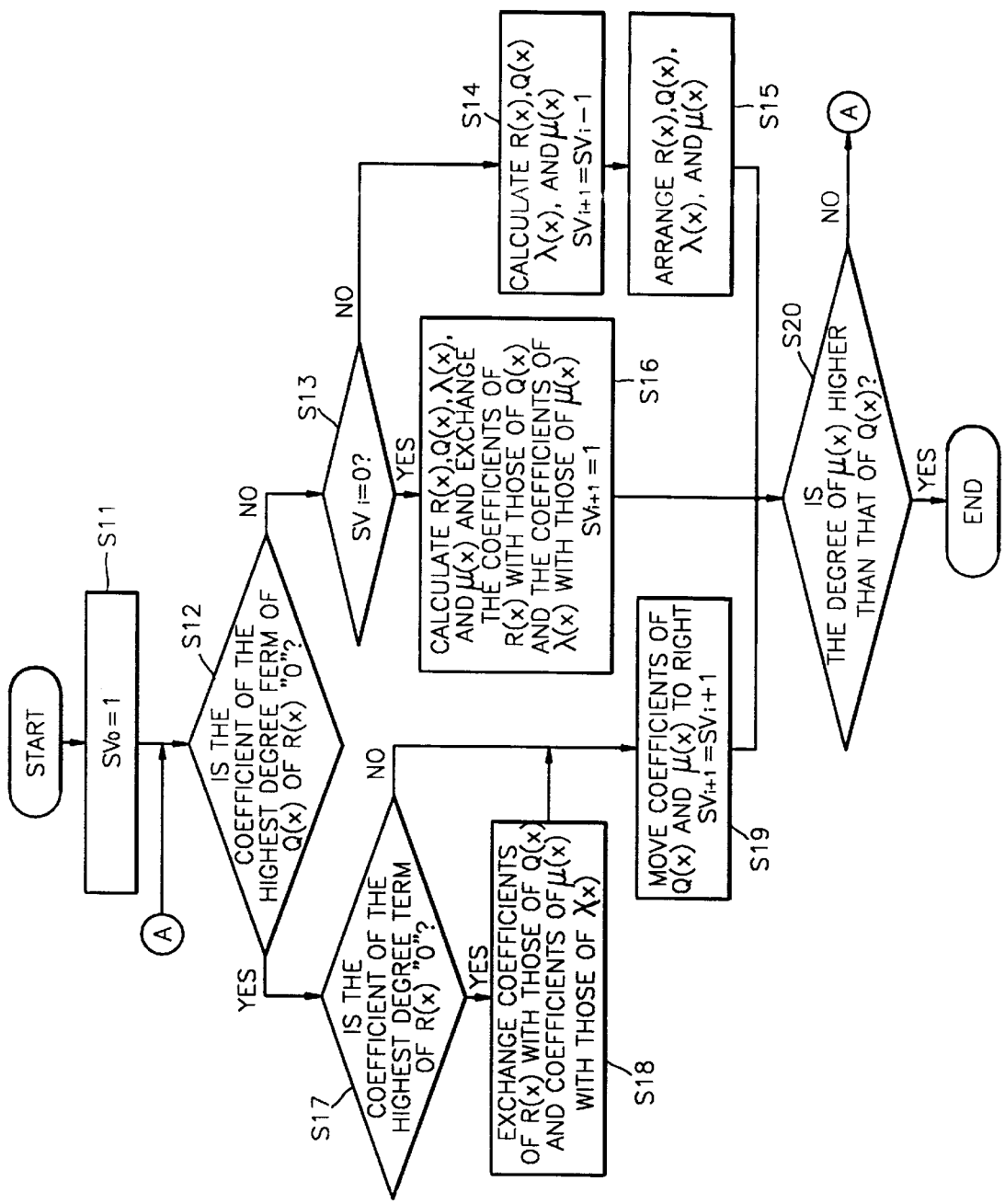
FIG. 8 is a flow chart according to an embodiment of the polynomial arranging method according to the present invention.
Figure 9:
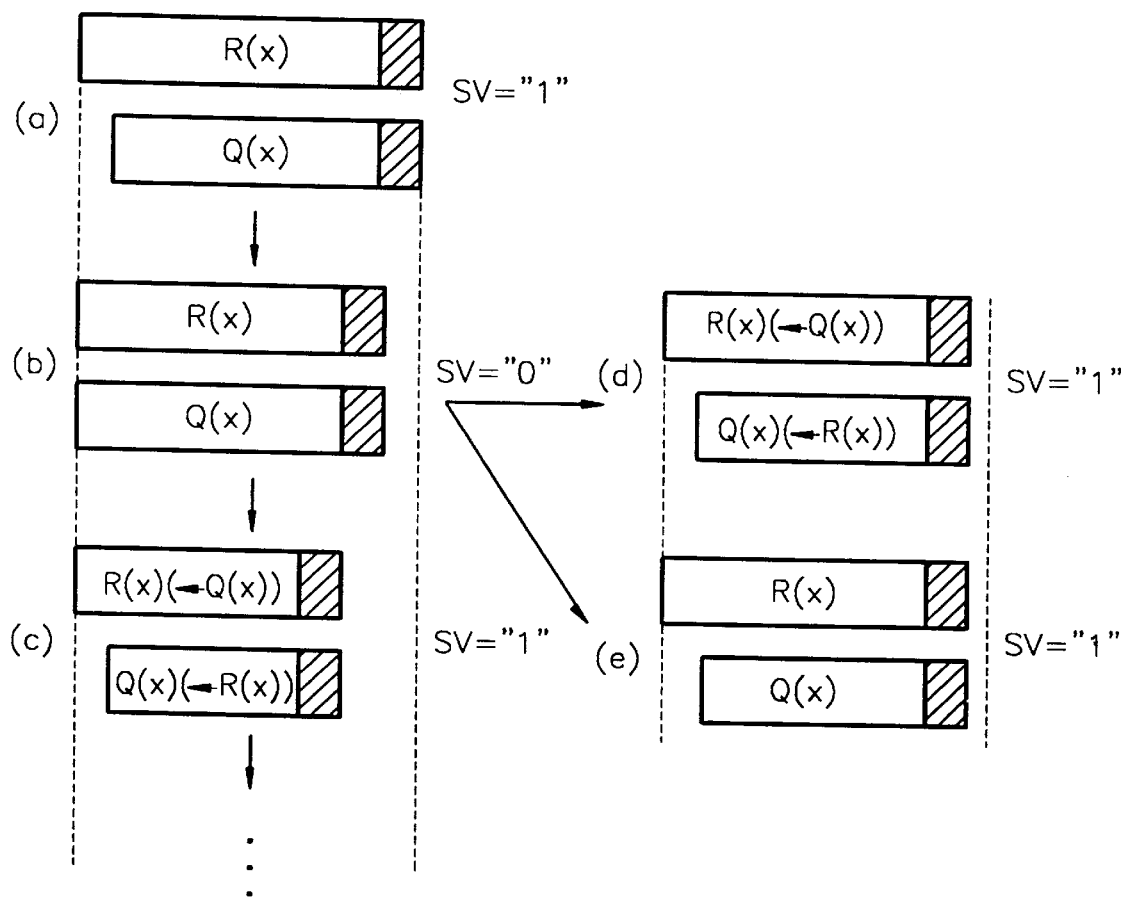
FIG. 9 is a view for facilitating appreciation of the polynomial arranging method shown in FIG. 8.

The present invention is different from the conventional technology in that it is necessary to always arrange R(x) and Q(x) to the left as the polynomials are arranged to the left in realizing the modified Euclidean algorithm. Therefore, FIG. 8 is a detailed flow chart for describing a method of arranging the coefficients of all the polynomials to the left in the step 1, which will be described with reference to FIG. 9.

The state variable SV is defined by the difference between the degree of R(x) and that of Q(x). The state variable SV has "1" as the initial value of the iterative calculations (step S11). In the arrangement architecture corresponding to an initial state variable $SV_0$, the degree of R(x) is higher than that of Q(x) by one degree as shown in FIG. 9(a). The coefficients of R(x) and Q(x) are arranged from the left. The degrees (the part marked with oblique lines) of the highest degree terms of the two polynomials are arranged in the same location.

The state variable SV decreases by "1" when normal iterative calculations are performed. When the coefficient of the highest degree term of one of the two polynomials is "0", the state variable SV increases by "1". Also, when the normal iterative calculations are performed when the state variable value is "0", the value of the next state variable becomes "1". Namely, when the normal iterative calculations are performed when the state variable value is "0", the values of two polynomials are exchanged and output. Therefore, the state variable is to have "−1" originally, however, it has "1".

Namely, in the step S12, it is determined whether the coefficient of the highest degree term of Q(x) or R(x) is "0". When the coefficient of the highest degree term of one of the two polynomials is not "0", it is determined whether a current state variable $SV_i$ is "0" (step S13).

When the current state variable $SV_i$ is not "0" in the step S13, the respective polynomials R(x), Q(x), λ(x), and μ(x) are calculated. The next state variable $SV_{i-1}$ is set as "0" by subtracting "1" from the current state variable ($SV_i$=1) (step S14). The coefficients of the calculated polynomials R(x), Q(x), λ(x), and μ(x) are delayed and arranged (step S15). At this time, in the coefficients of the polynomials R(x) and Q(x), the degree of R(x) is lowered by one degree as shown in FIG. 9(b). The state variable value is "0" in the arrangement architecture (FIG. 9(b)). Additionally, when the current state variable is "1" and the coefficients of the highest degree terms of the two polynomials are not "0" (FIG. 9(a)), the degree of R(x) is lowered by one degree as shown in FIG. 9(b).

When the current state variable $SV_i$ is "0" in the step S13, it means that the coefficients of the highest degree terms of R(x) and Q(x) are the same. After calculating the respective polynomials R(x), Q(x), λ(x), and μ(x), the coefficients of R(x) are exchanged with those of Q(x) and the coefficients of λ(x) are exchanged with those of μ(x) since the degree of R(x) is lower than that of Q(x). The state variable $SV_{i+1}$ is set as "1" (step S16). At this time, the arrangement architecture for the coefficients of the polynomials R(x) and Q(x) is as shown in FIG. 9(c).

When the coefficient of the highest degree term of one of the two polynomials Q(x) and R(x) is "0" in the step S12, it is determined whether the coefficient of the highest degree term of R(x) is "0" (step S17). When the coefficient of the highest degree term of R(x) is "0", the coefficients of R(x) are exchanged with those of Q(x) and the coefficients of λ(x) are exchanged with those of μ(x) since the degree of R(x) is lower than that of Q(x) (step S18). The coefficients of the two polynomials Q(x) and μ(x) are moved to the right by one degree. The next state variable $SV_{i-1}$ is set as the value obtained by adding "1" to the current state variable $SV_i$ (step S19). At this time, the arrangement architecture for the coefficients of the polynomials R(x) and Q(x) is as shown in FIG. 9(d).

When the coefficient of the highest degree term of R(x) is not "0" and the coefficient of the highest degree term of Q(x) is "0", since the degree of R(x) is higher than that of Q(x), the step S19, in which the coefficients of the two polynomials Q(x) and μ(x) are moved to right by one degree and the next state variable $SV_{i-1}$ is set as the value obtained by adding "1" to the current state variable $SV_i$, is performed. At this time, the arrangement architecture for the coefficients of the polynomials R(x) and Q(x) is as shown in FIG. 9(e).

After performing the steps S15, S16, and S19, it is determined whether the degree of μ(x) is higher than that of Q(x) (step S20). Until the degree of μ(x) is higher than that of Q(x), the process is fed back to the step S12 and the steps S12 through S19 are iteratively performed.

In the circuit according to the present invention, the arrangement architecture of a polynomial is changed.

Accordingly, degree buffering is not necessary since an additional degree comparing circuit is not necessary, thus simplifying the hardware.

Also, according to the present invention, it is possible to perform desired iterative operations without directly comparing the highest degrees of the respective polynomials with each other in calculating the modified Euclidean algorithm. Buffering is not necessary since it is not necessary to store the current degrees of the respective polynomials.

What is claimed is:

1. A Reed-Solomon (RS) decoder for correcting an error of a received symbol using a modified Euclidean algorithm, comprising:

a calculator for iteratively calculating polynomials $R(x)$, $Q(x)$, $\lambda(x)$, and $\mu(x)$ for the modified Euclidean algorithm using an input initial error locator polynomial and a modified syndrome polynomial;

an arranger for arranging the coefficients of the polynomials $R(x)$, $Q(x)$, $\lambda(x)$, and $\mu(x)$ from the left;

a generator for generating control signals, each respectively indicating an effective section of the polynomials $R(x)$, $Q(x)$, and $\mu(x)$, in accordance with an iterative control signal indicating a beginning of every iterative calculation; and an extractor for extracting the polynomial $R(x)$ supplied from the calculator as an error estimator polynomial and the polynomial $\lambda(x)$ as an error locator polynomial on the basis of the control signals.

2. The RS decoder of claim 1, wherein the generator assigns the control signal of one bit to each of the polynomials $R(x)$, $Q(x)$, and $\mu(x)$, maintains values of the respective control signals of the polynomials $R(x)$, $Q(x)$, and $\mu(x)$ at a first logic state when the iterative control signal is provided, and, when a coefficient of the polynomials $R(x)$, $Q(x)$, or $\mu(x)$ which is not "0" is first supplied from the arranger, the control signal respectively assigned to the polynomial $R(x)$, $Q(x)$, or $\mu(x)$ is changed to be at a second logic state.

3. The RS decoder of claim 2, wherein the calculator further comprises a storage for storing first effective values of $R(x)$ and $Q(x)$ supplied from the arranger, according to the control signals of $R(x)$ and $Q(x)$ generated by the generator, as the coefficients of highest degree terms of the polynomials $R(x)$ and $Q(x)$.

4. The RS decoder of claim 2, wherein the extractor outputs $R(x)$ as an error estimator polynomial and $\lambda(x)$ as an error locator polynomial when the control signal of $Q(x)$ supplied from the generator is not in an effective section and the control signal of $\mu(x)$ is determined to be in the effective section.

5. The RS decoder of claim 2, further comprising an arrangement controller for generating a shift signal and an exchange control signal based on the control signals of $R(x)$ and $Q(x)$ generated by the generator, determining a state variable showing a difference between a degree of $R(x)$ and a degree of $Q(x)$, and controlling the arrangement of the coefficients of polynomials $R(x)$, $Q(x)$, $\lambda(x)$, and $\mu(x)$ in the arranger.

6. The RS decoder of claim 5, wherein the arrangement controller provides an exchange control signal for exchanging the coefficients of $R(x)$ with the coefficients of $Q(x)$ and the coefficients of $\mu(x)$ with the coefficients of $\lambda(x)$, when the coefficient of the highest degree term of $R(x)$ is "0", using the control signals of $R(x)$ and $Q(x)$, and a shift signal for moving the polynomial $R(x)$ and $\lambda(x)$ forming a pair to the right by one degree to the arranger and provides only a shift signal for moving the polynomial $Q(x)$ and $\mu(x)$ forming a pair to the right by one degree to the arranger when the coefficient of the highest degree term of $Q(x)$ is "0".

7. The RS decoder of claim 6, wherein the arranger arranges the coefficients of the two polynomials after delaying them by a unit time, when a state variable showing that the degrees of the two polynomials $R(x)$ and $Q(x)$ are the same is supplied from the arrangement controller and arranges the coefficients of the two polynomials without delaying them when a state variable showing that the degree of one of the two polynomials is higher than that of the other is supplied from the arrangement controller.

8. A Reed-Solomon (RS) decoder for determining a location and a size of an error based on syndrome values, comprising:

a first polynomial calculator for calculating a syndrome value from received data and constructing a syndrome polynomial;

a first generator for generating a root for an initial error locator polynomial from erasure information of the received data and an iterative control signal indicating a beginning of iterative calculations whenever new erasure information is input;

a first polynomial expander for expanding the initial error locator polynomial using the root;

a second polynomial expander for expanding a modified syndrome polynomial using the syndrome value and the root;

a modified Euclidean algorithm calculator for extracting an error estimator polynomial and an error locator polynomial using the initial error locator polynomial and the modified syndrome polynomial;

second and third polynomial calculators for calculating the error estimator polynomial and error locator polynomial supplied from the modified Euclidean algorithm calculator; and an extractor for extracting the size and the location of an error included in the received data from the error estimator polynomial and error locator polynomial calculated by the second and third polynomial calculators and error correction decoding the received data, wherein the modified Euclidean algorithm calculator comprises:

a calculator for iteratively calculating polynomials $R(x)$, $Q(x)$, $\lambda(x)$, and $\mu(x)$ for the modified Euclidean algorithm using the initial error locator polynomial and the modified syndrome polynomial;

an arranger for arranging the coefficients of the polynomials $R(x)$, $Q(x)$, $\lambda(x)$, and $\mu(x)$ from the left and providing the coefficients of the arranged polynomials $R(x)$, $Q(x)$, $\lambda(x)$, and $\mu(x)$ to the calculator;

a control signal generator for generating the control signals of $R(x)$, $Q(x)$, and $\mu(x)$ showing the effective sections of the polynomials $R(x)$, $Q(x)$, and $\mu(x)$ using the iterative control signal;

a storage for storing first effective values of $R(x)$ and $Q(x)$ supplied from the arranger as coefficients of the highest degree terms using the control signals of $R(x)$ and $Q(x)$ as enable signals, and providing the coefficients of the highest degree terms to the calculator;

a select signal generator for generating a select signal using the control signals of $Q(x)$ and $\mu(x)$; and a selector for selecting the polynomial $R(x)$ supplied from the calculator according to the select signal as the error estimator polynomial and the polynomial $\lambda(x)$ as the error locator polynomial.

9. The RS decoder of claim 8, wherein the select signal generator generates a select signal so as to select R(x) as the error estimator polynomial and λ(x) as the error locator polynomial by the selector when the control signal of Q(x) is not in the effective section and the control signal of μ(x) is in the effective section.

10. The RS decoder of claim 8, further comprising a determiner for generating a shift signal and an exchange control signal, determining a state variable for showing a difference between the degree of the polynomial R(x) and that of the polynomial Q(x) using the control signals of R(x) and Q(x), and providing the shift signal, the exchange control signal, and the state variable to the arranger.

11. The RS decoder of claim 8, wherein the determiner provides an exchange control signal for exchanging the coefficients of R(x) with the coefficients of Q(x) and exchanging the coefficients of μ(x) with the coefficients of λ(x), when the coefficient of the highest degree term of R(x) is "0", using the control signals of R(x) and Q(x) and a shift signal for moving the polynomial R(x) and λ(x) forming a pair to the right by one degree to the arranger, and providing a shift signal for moving the polynomial Q(x) and μ(x) forming a pair to right by one degree to the arranger when the coefficient of the highest degree term of Q(x) is "0".

12. The RS decoder of claim 11, wherein the arranger arranges the coefficients of the polynomials R(x) and Q(x) after delaying them by a unit time, when a state variable indicating that the degrees of the polynomials R(x) and Q(x) are the same is supplied from the determiner, and arranges the coefficients of the polynomials R(x) and Q(x) without delaying them when a state variable indicating that the degree of one of the polynomials R(x) or Q(x) is higher than the degree of the other polynomial is supplied from the determiner.

13. A Reed-Solomon decoding method for correcting an error of a received symbol using a modified Euclidean algorithm, comprising the steps of:
   (a) arranging the coefficients of the polynomials R(x), Q(x), λ(x), and μ(x) for the modified Euclidean algorithm from the left;
   (b) generating control signals of the respective polynomials showing from where the coefficients of the polynomials arranged from the left are effective;
   (c) determining degrees of the polynomials Q(x) and μ(x) using the control signals assigned to the polynomials Q(x) and μ(x);
   (d) outputting R(x) as an error estimator polynomial and λ(x) as an error locator polynomial when the degree of μ(x) is determined to be higher than that of Q(x) in the step (c), and determining whether the coefficient of the highest degree term of one of R(x) and Q(x) is "0" when the degree of μ(x) is determined not to be higher than that of Q(x) in the step (c); and
   (e) shifting the coefficients of the polynomial having the highest degree term of which is "0" and the polynomial forming a pair to the right by one degree when the coefficient of the highest degree term of one of the polynomials R(x) and Q(x) is determined to be "0" in the step (d), and iteratively calculating the polynomials R(x), Q(x), λ(x), and μ(x) when the coefficient of the highest degree term of one of the polynomials R(x) and Q(x) is determined not to be "0" in the step (d).

14. The method of claim 13, wherein the coefficients of Q(x) and μ(x) are shifted to the right by one degree after exchanging the coefficients of R(x) with those of Q(x) and the coefficients of μ(x) with those of λ(x) when the coefficient of the highest degree term of R(x) is "0" in the step(e).

15. The method of claim 13, wherein the coefficients of Q(x) and μ(x) are shifted to the right by one degree when the coefficient of the highest degree term of Q(x) is "0" in the step (e).

16. The method of claim 13, wherein the degrees of Q(x) and μ(x) are determined based on information indicating where the coefficient of Q(x) and the coefficient of μ(x) which are not "0" are first arranged in the step (a), in response to an iterative control signal indicating a beginning of the iterative calculations in the step (c).

17. The method of claim 13, further comprising step (f) of storing the coefficients of the highest degree terms of the polynomials R(x) and Q(x) using the control signals of R(x) and Q(x) generated in the step (b),
   wherein the stored coefficients of the highest degree terms are used in the step (e) for iteratively calculating the polynomials R(x), Q(x), λ(x), and μ(x).

18. An RS decoding method including a polynomial arranging step for performing a modified Euclidean algorithm, wherein the polynomial arranging step comprises the steps of:
   (a) setting an initial state variable;
   (b) determining whether a coefficient of a highest degree term of one of polynomials Q(x) and R(x) is "0" and determining whether the degrees of the polynomials Q(x) and R(x) are the same;
   (c) calculating polynomials R(x), Q(x), λ(x), and μ(x), obtaining a next state variable by subtracting "1" from the current state variable, and arranging coefficients of the calculated polynomials after delaying them when the degrees of the polynomials Q(x) and R(x) are not the same in the step (b);
   (d) exchanging the coefficients of R(x) with the coefficients of Q(x) and the coefficients of λ(x) with the coefficients of μ(x) after calculating the polynomials R(x), Q(x), λ(x), and μ(x) and setting the next state variable as "1" when the degrees of the polynomials Q(x) and R(x) are the same in the step (b);
   (e) determining whether the coefficient of the highest degree term of R(x) is "0" when the coefficient of the highest degree term of one of two polynomials Q(x) and R(x) is "0" in the step (b);
   (f) moving the coefficients of the polynomials Q(x) and μ(x) to the right by one degree after exchanging the coefficients of R(x) with the coefficients of Q(x) and the coefficients of λ(x) with the coefficients of μ(x), and setting the next state variable as the value obtained by adding "1" to the current state variable, when the coefficient of the highest degree term of R(x) is "0" in the step (e); and
   (g) moving the coefficients of the polynomials Q(x) and μ(x) to the right by one degree and setting the next state variable as the value obtained by adding "1" to the current state variable when the coefficient of the highest degree term of Q(x) is "0" in the step(e).

19. The method of claim 18, further comprising the step (h) of determining whether the degree of the polynomial μ(x) is higher than that of the polynomial Q(x) after performing the steps (c), (d), (f) or (g), and iteratively repeating the steps (b) through (g) if the degree of the polynomial μ(x) is higher than that of the polynomial Q(x).

20. The method of claim 18, wherein the initial state variable is "1", the degree of R(x) is higher than that of Q(x) by one degree in the arrangement architecture of the polynomials R(x) and Q(x) corresponding to the initial state variable, the coefficients of the polynomials R(x) and Q(x) are arranged from the left, and the degrees of the highest degree terms of the polynomials R(x) and Q(x) are arranged in the same location.

* * * * *